(12) United States Patent
Sorokopud et al.

(10) Patent No.: US 10,469,106 B2
(45) Date of Patent: Nov. 5, 2019

(54) MULTI-CHANNEL DIGITAL RADIO

(71) Applicant: Elbit Systems Land and C4I Ltd., Netanya (IL)

(72) Inventors: Boris Sorokopud, Netanya (IL); Yehuda Eder, Netanya (IL); Yonatan Manor, Netanya (IL)

(73) Assignee: Elbit Systems Land and C4I Ltd., Netanya (IL)

( * ) Notice: Subject to any disclaimer, the term of this patent is extended or adjusted under 35 U.S.C. 154(b) by 0 days.

(21) Appl. No.: 15/781,743

(22) PCT Filed: Nov. 17, 2016

(86) PCT No.: PCT/IL2016/051238
§ 371 (c)(1),
(2) Date: Jun. 6, 2018

(87) PCT Pub. No.: WO2017/098497
PCT Pub. Date: Jun. 15, 2017

(65) Prior Publication Data
US 2018/0367167 A1    Dec. 20, 2018

(30) Foreign Application Priority Data
Dec. 10, 2015    (IL) .......................................... 243028

(51) Int. Cl.
*H04B 1/18*    (2006.01)
*H04B 1/00*    (2006.01)
(Continued)

(52) U.S. Cl.
CPC ........... *H04B 1/005* (2013.01); *H03H 9/6406* (2013.01); *H03H 9/72* (2013.01)

(58) Field of Classification Search
CPC . H04B 1/005; H04B 1/38; H04B 1/40; H04B 1/401; H04B 1/406; H04B 1/44; H04B 1/48
See application file for complete search history.

(56) References Cited

U.S. PATENT DOCUMENTS 3,855,556 A    12/1974  Hartmann
6,792,267 B1 *  9/2004  Backstrom ............... H04B 7/04
                                                    375/220
(Continued)

FOREIGN PATENT DOCUMENTS

CN    101452013    6/2009
CN    103763763    4/2014
(Continued)

OTHER PUBLICATIONS

International Search Report of PCT Application No. PCT/IL2016/051238, dated Mar. 9, 2017.
(Continued)

*Primary Examiner* — Tuan Pham
(74) *Attorney, Agent, or Firm* — Pearl Cohen Zedek Latzer Baratz LLP

(57) ABSTRACT

Multi-channel communication devices and methods are provided, which employ a filter bank, connected between antenna(s) and wideband converter(s), that comprises many narrowband surface acoustic wave (SAW) filters having respective distinct frequency bands within a bandwidth of the wideband converter(s). For example, devices may be configured as multi-channel receivers with SAW filters replacing current heterodyne circuitry and achieving effective separation of reception channel and effective attenuation of adjacent blocking signals in a compact device. In other examples, devices may be configured as multi-channel
(Continued)

transmitters and/or transceivers, possibly having a variable number of channels, to realize compact multi-channel radio.

16 Claims, 11 Drawing Sheets

(51) Int. Cl.
*H03H 9/72* (2006.01)
*H03H 9/64* (2006.01)

(56) References Cited

U.S. PATENT DOCUMENTS

| | | | |
|---|---|---|---|
| 6,963,297 B2* | 11/2005 | Robinson | H03F 3/24 341/143 |
| 6,965,788 B1 | 11/2005 | Barratt et al. | |
| 7,058,037 B1 | 6/2006 | Moon | |
| 7,379,723 B2 | 5/2008 | Rafi | |
| 8,954,025 B2 | 2/2015 | Vogas | |
| 9,350,404 B2 | 5/2016 | Adnani et al. | |
| 2003/0020644 A1* | 1/2003 | Yeap | H03M 1/121 341/144 |
| 2003/0153294 A1* | 8/2003 | Hata | H04B 1/0003 455/302 |
| 2006/0114969 A1 | 6/2006 | Ahn et al. | |
| 2009/0088124 A1 | 4/2009 | Schuur et al. | |
| 2010/0291882 A1 | 11/2010 | Hu et al. | |
| 2012/0302188 A1 | 11/2012 | Sahota et al. | |
| 2013/0156074 A1 | 6/2013 | Wang Hans et al. | |
| 2013/0178179 A1 | 7/2013 | Han et al. | |
| 2014/0062614 A1 | 3/2014 | Park | |
| 2014/0247804 A1* | 9/2014 | Wermuth | H04W 72/02 370/330 |
| 2016/0124041 A1* | 5/2016 | Pathak | G01R 29/08 324/629 |

FOREIGN PATENT DOCUMENTS

| | | |
|---|---|---|
| EP | 2762921 | 8/2014 |
| RU | 2333596 | 9/2008 |
| WO | WO 2017/098497 | 6/2017 |

OTHER PUBLICATIONS

Office action of CA patent application 2,983,912, dated Nov. 14, 2017.

Bostian, Charles W., et al. Trade study of implementation of software defined radio (sdr): Fundamental limitations and future prospects. No. 430304. Wireless@ Virginia Tech, Dec. 9, 2008, pp. 3-115.

Extended European Search Report for EP Application No. EP16872541.4, dated Jun. 20, 2018.

* cited by examiner

MULTI-CHANNEL DIGITAL RADIO

CROSS-REFERENCE TO RELATED APPLICATIONS

This application is a National Phase Application of PCT International Application No. PCT/IL2016/051238, International Filing Date Nov. 17, 2016, entitled "MULTI-CHANNEL DIGITAL RADIO", published on Jun. 15, 2017 under Publication No. WO 2017/098497, which claims priority of Israel Patent Application No. 243028, filed Dec. 10, 2015, all of which are hereby incorporated by reference in their entireties

BACKGROUND OF THE INVENTION

1. Technical Field

The present invention relates to the field of radio communication, and more particularly, to multi-channel radios.

2. Discussion of Related Art

FIGS. 1A and 1B are high level schematic block diagrams prior art receivers 91 and transmitters 92, respectively. Receiver 91 (FIG. 1A) is a super-heterodyne receiver which converts an incoming signal that may have different carrier frequencies into a signal at a predefined intermediate frequency, from which the information modulated into the incoming signal is decoded. Receiver 91's bandwidth is illustrated schematically in diagram 60 referring to the VHF and UHF radio regions (very high frequencies, 30-300 MHz, and ultra-high frequencies, 300-3000 MHz, respectively) of the electromagnetic spectrum. The signal is received through antenna 91A, its bandwidth is narrowed (schematically illustrated in diagram 61) by a Band Pass Filter (BPF) and Digital Control Attenuator (DCA) components and the signal amplified by a low-noise amplifier (LNA) at stage 91C. Then, at stage 91D, a frequency mixer is used to modify the carrier frequency into a first intermediate frequency ($IF_1$) by mixing the signal with a frequency generated by a respective synthesizer to yield signal 62 at the intermediate frequency. The signal from stage 91D is typically transformed again by a stage 91E into another intermediate frequency ($IF_2$) to remove disturbing frequencies such as mirror frequencies and adjacent frequencies from blocking signals, and yield signal 63 that may then be converted into digital information by Analog to Digital Converter (ADC) 91F. Stages 91C-91F represent the de-modulation stage 91B of a single received channel, the digital information from which is then delivered for further processing (stage 91G) by field-programmable gate array (FPGA) and digital signal processing (DSP) or microprocessor (µP).

Prior art multi-channel receivers 91 employ multiple de-modulation stages 91B, each tuned to receive a different frequency by generating correspondingly different frequencies by the synthesizers (intermediate frequencies $IF_1$, $IF_2$ are typically the same for all channels), to yield multiple channels.

Transmitter 92 (FIG. 1B) has a structure that basically corresponds to the structure of receiver 91. Processing elements 92A (e.g., DSP, µP, FPGA) generate digital signals which are fed into one or more modulation stage(s) 92B and are converted by corresponding digital to analog converter(s) 92C. The analog signal is then mixed at stages 92D, 92E with synthesized frequencies to reach the carrier frequency range and then filtered and amplified in stage 92F (by low pass filter—LPF, driver and power amplifier and harmonic filter) to yield a signal 70 which is broadcasted by antenna 92G. It is noted that equivalent components in receiver 91 and transmitter 92 were denoted by different numerals in order to streamline their explanation. Clearly, processing stages 91G, 92A and antennas 91A, 92G may be implemented as single components, respectively, in a transceiver that combines receiver 91 and transmitter 92.

The following patents and patent applications are incorporated herein by reference in their entirety: U.S. Patent Publication No. 20130178179 teaches a subsampling receiver using interstage off-chip RF band pass filter; U.S. Patent Publication No. 2014062614 teaches a switching circuit for selecting a frequency band; Chinese Patent Document No. 101452013 teaches a switch filter array case system for calibration of a spectrum analyzer and a vector signal analyzer; and U.S. Pat. No. 3,855,556 teaches a selectable frequency bandpass filter that modulates an analog signal by applying variable delays on the input signal.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a multi-channel communication device comprising, connected between at least one antenna and at least one wideband converter, a filter bank that comprises a plurality of narrowband surface acoustic wave (SAW) filters having respective distinct frequency bands within a bandwidth of the at least one converter.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1A:
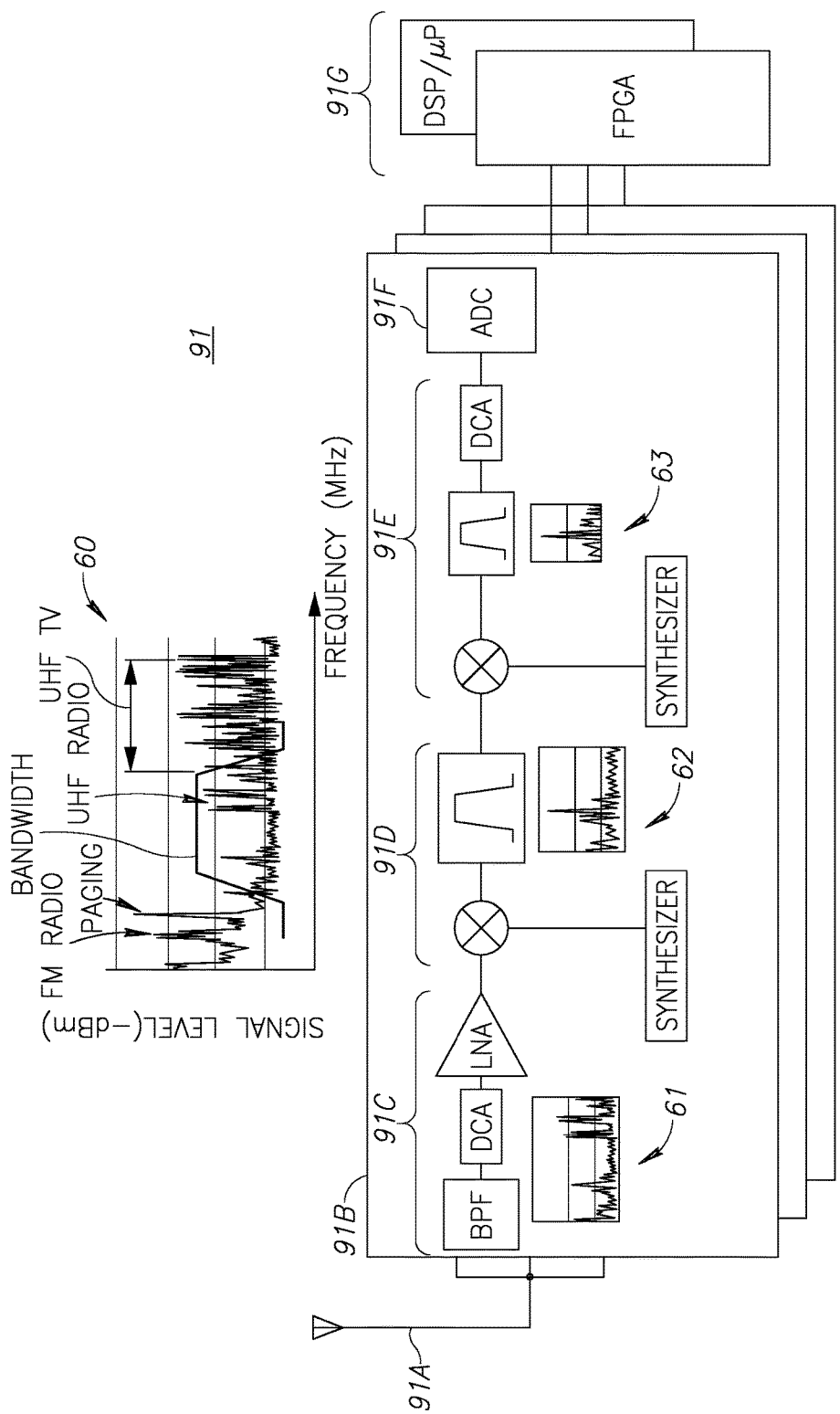
FIGS. 1A and 1B are high level schematic block diagrams of prior art receivers and transmitters, respectively.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways. Also, it is to be understood that the phraseology and terminology employed herein is for the purpose of description and should not be regarded as limiting.

Multi-channel communication devices and methods are provided, which employ a filter bank, connected between antenna(s) and wideband converter(s), that comprises many narrowband surface acoustic wave (SAW) filters having respective distinct frequency bands within a bandwidth of the wideband converter(s). For example, devices may be configured as multi-channel receivers with SAW filters replacing current heterodyne circuitry and achieving effective separation of reception channel and effective attenuation of adjacent blocking signals in a compact device. In other examples, devices may be configured as multi-channel transmitters and/or multi-channel transceivers, possibly having a variable number of channels, to realize compact multi-channel radio. The disclosed devices and methods may be implemented in handheld or backpack devices, and provide increased battery life.

The SAW frequency-switch filter bank may be used in receivers as a pre-selector with the pass band as the channel band width, for reducing co-location interferences and improving the receiver's selectivity in mobile operated radios and for increasing the dynamic range of the receivers. A filter bank may be used as a front end for single channel receivers and/or multi-channel receivers with very large dynamic ranges. The output of the filter bank module may be connected directly to a wideband ADC (analog to digital conversion), and thus solve ADC dynamic range problems that limit the use of the ADC capabilities in simple receiver architectures with high selectivity performances.

Figure 2A:
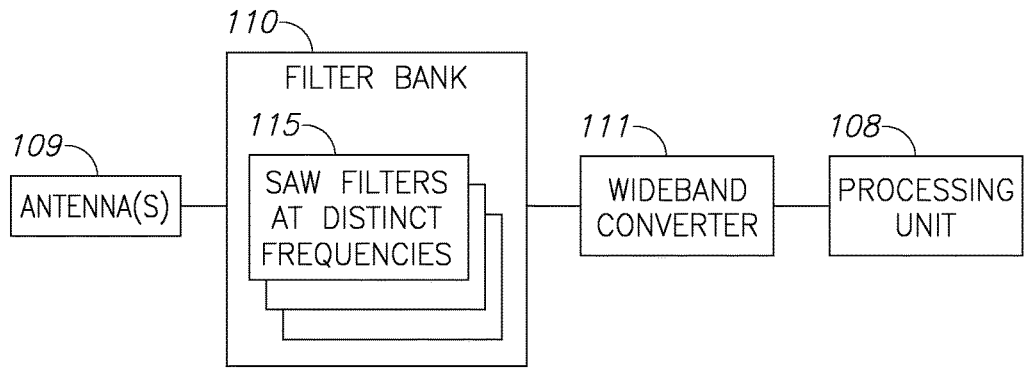
FIG. 2A is a high level schematic block diagram of a multi-channel communication device, according to some embodiments of the invention.

FIG. 2A is a high level schematic block diagram of a multi-channel communication device 100, according to some embodiments of the invention. Multi-channel communication device 100 comprises, connected between at least one antenna 109 and at least one wideband converter 111, a filter bank 110 that comprises a plurality of narrowband surface acoustic wave (SAW) filters 115 having respective distinct frequency bands within a bandwidth of converter(s) 111, e.g., the frequency coverage may be between 225-512 MHz. Wideband converter 111 may be connected to processing unit(s) 108. It is noted that in FIG. 2A, antenna 109 may represent any of antennas 91A, 92G, wideband converter 111 may represent any of ADC 91F and DAC 92C and processing unit 108 may represent any of processing units 91G, 92A.

Figure 2B:
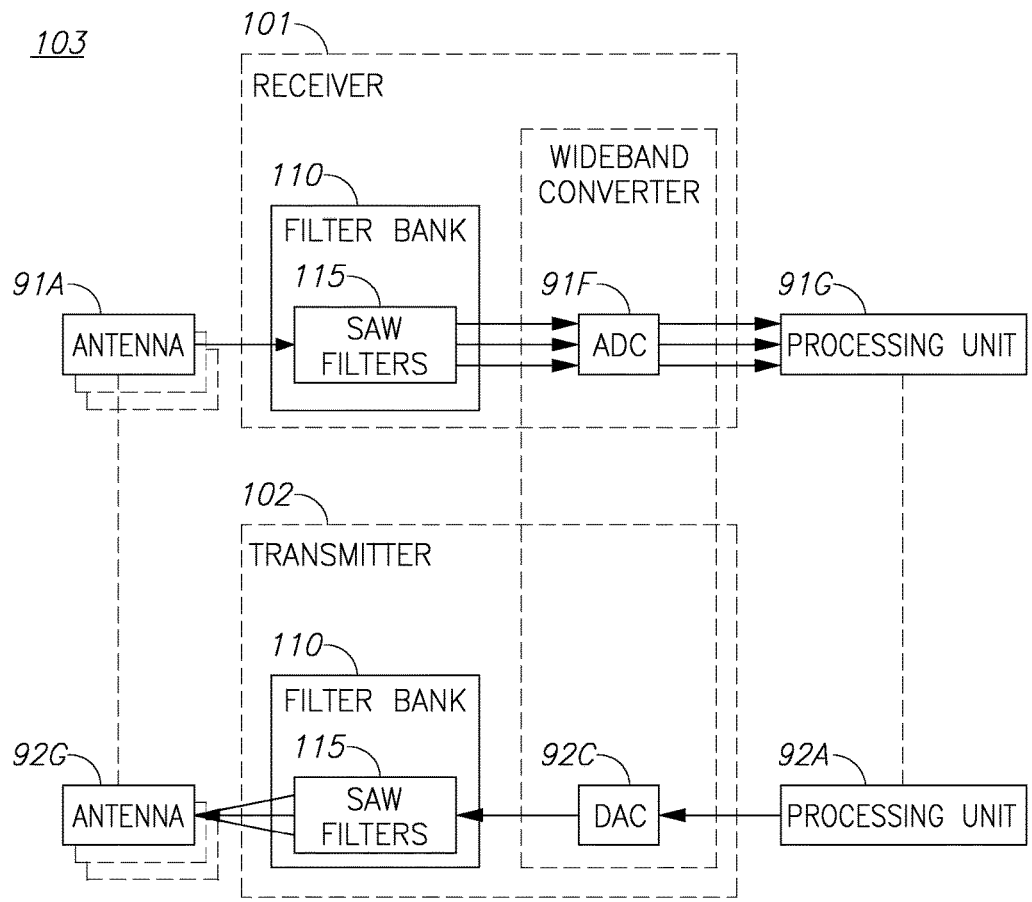
FIG. 2B is a high level schematic block diagram of a multi-channel communication system, according to some embodiments of the invention.

FIG. 2B is a high level schematic block diagram of a multi-channel communication system 103, according to some embodiments of the invention. Communication system 103 may represent a single device having a receiver 101 and a transmitter 102 (termed in such case transceiver 103), different devices configured as receiver(s) 101 and transmitter(s) 102, and/or combinations thereof. In certain embodiments, device 100 may be configured as receiver 101, wideband converter 111 may comprise ADC 91F, antenna 91A may be configured to receive radiofrequency (RF) radiation within a specified frequency band that at least partly overlaps the frequency bands of SAW filters 115 and the bandwidth of ADC 91F, and receiver 101 may be configured to deliver a plurality of reception channels to processing unit 91G, which correspond to at least some of the SAW filter frequency bands, converted by ADC 91F. In certain embodiments, device 100 may be configured as transmitter 102, wideband converter 111 may comprise DAC 92C, antenna 92G may be configured to receive radiofrequency (RF) radiation within a specified frequency band that at least partly overlaps the frequency bands of SAW filters 115 and the bandwidth of DAC 92C, and transmitter 102 may be configured to modulate signals from processing unit 92A by DAC 92C into a plurality of transmission channels which correspond to at least some of the SAW filter frequency bands, and broadcast the transmission channel through antenna 92G.

In certain embodiments, device 100 may be configured as a transceiver 103, wherein wideband converter 111 comprises ADC 91F and DAC 92C and one or more antenna(s) 91A, 92G may be configured to receive and transmit radiofrequency (RF) radiation within a specified frequency band that at least partly overlaps the frequency bands of SAW filters 115 and the bandwidths of ADC 91F and the DAC 92C. Transceiver 103 may be configured to deliver to processing unit 91G multiple reception channels that correspond to at least some of the SAW filter frequency bands and are converted by ADC 91F, and to deliver from processing unit 92A, after conversion by DAC 92C, multiple transmission channels that correspond to at least some of the SAW filter frequency bands for broadcasting by antenna 92G.

Figure 3:
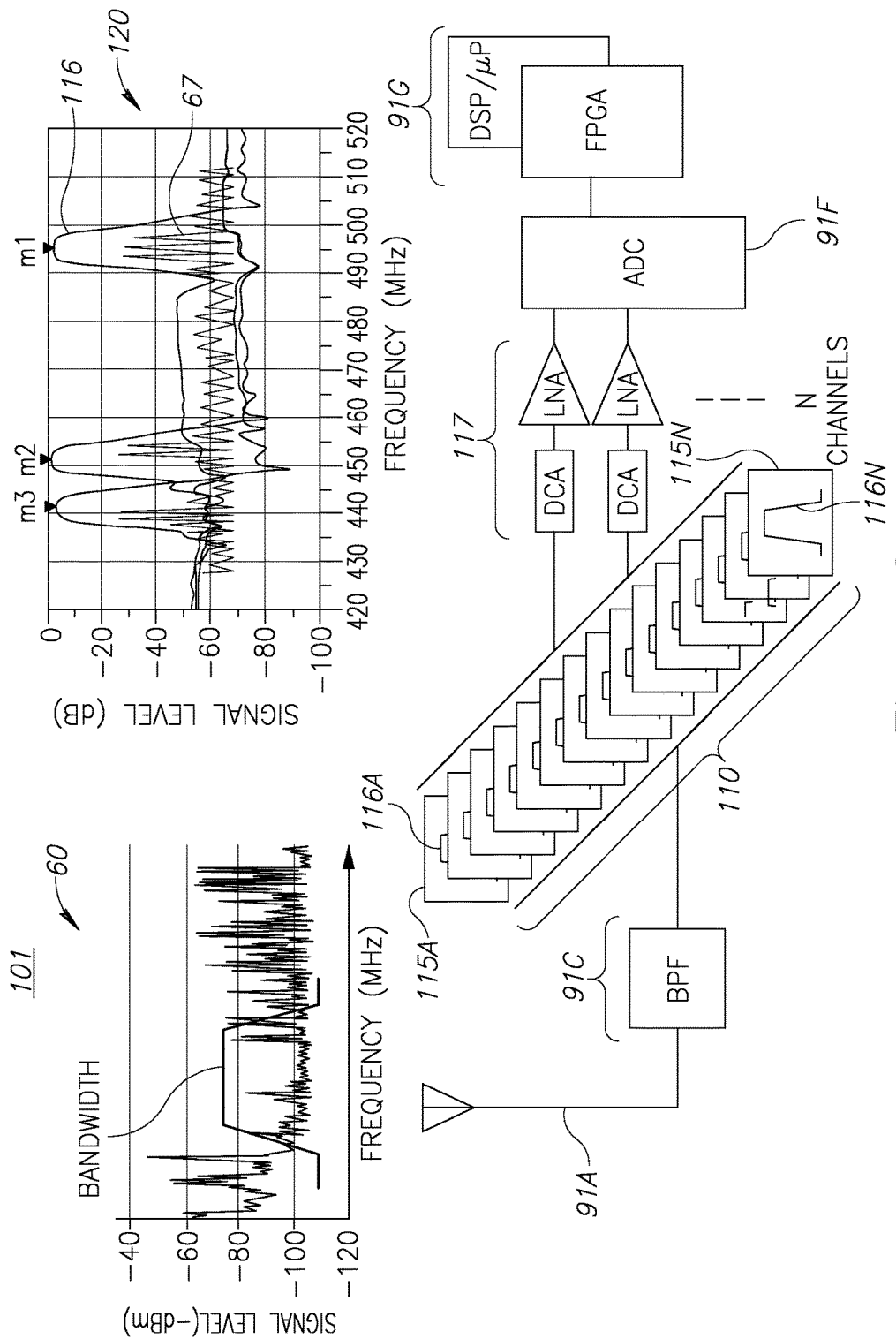
FIG. 3 is a high level schematic block diagram of a multi-channel UHF receiver, according to some embodiments of the invention.

FIG. 3 is a high level schematic block diagram of multi-channel UHF receiver 101, according to some embodiments of the invention. FIG. 3 exemplifies device 100 configured as receiver 101 in UHF, as a comparison to prior art receiver 91 depicted in FIG. 1A. In place of the cumbersome set of de-modulation stages 91B, receiver 101 essentially comprises a set of SAW filters 115 which may be fitted on a small printed board, connected to broadband ADC 91F that spans the combined frequency band range of SAW filters 115 in filter bank 110. SAW filters 115 may be configured to provide N reception channels, each of filters 115A-115N having distinct frequency band 116A-116N. DCA and LNA 117 may be connected prior to filter bank 110 or after each SAW filter 115 to amplify the signal before or after filtering, respectively. SAW filters 115A-115N have distinct frequency bands 116A-116N to provide N distinct reception channels that can be converted to digital signals simultaneously by a single ADC 91F, or in certain embodiments by two or more ADC's 91F, depending on specific implementation details (relating e.g., to ease and cost of manufacture). Diagram 120 illustrates schematically three frequency bands 116 (m1, m2, m3) and the received signals 67 after efficient filtering by SAW filters 115.

The parts of signal 67 which correspond to each of frequency bands 116 (m1, m2, m3) are clearly distinct, and may thus be effectively separated by ADC 91F.

Figures 4A, 4B:
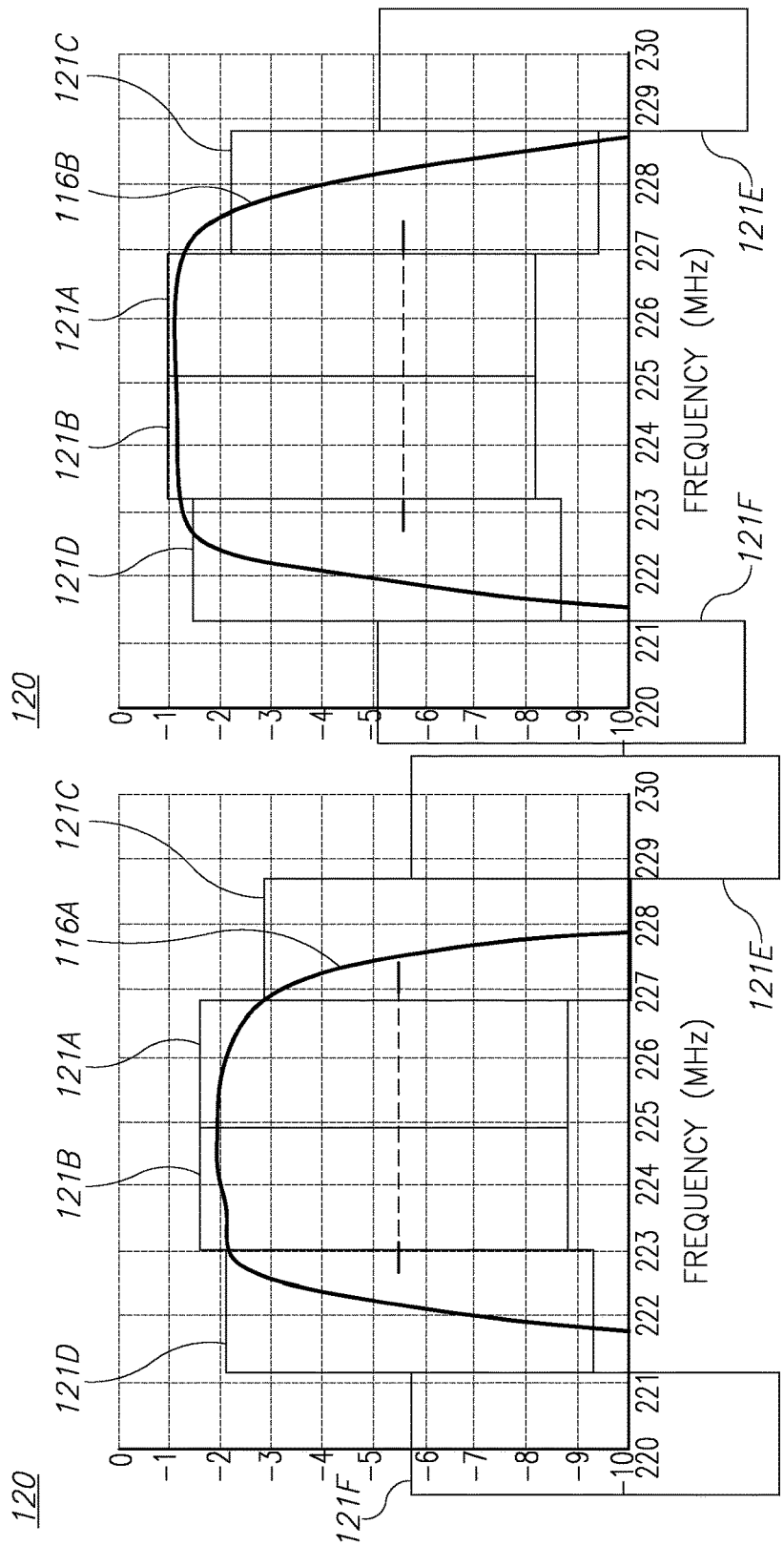
FIGS. 4A and 4B are schematic examples for relating SAW filters frequency bands with bandwidths of the individual communication channels in the multi-channel radio, according to some embodiments of the invention.

FIGS. 4A and 4B are schematic examples for relating SAW filters frequency bands 116A, B with bandwidths 121A-F of the individual communication channels in the multi-channel radio, according to some embodiments of the invention. These and similar examples may be used to design and determine the specifications of SAW filters 115 according to given requirements concerning required communication channel bandwidths and inter-channel interference thresholds and/or design and determine the communication channel bandwidths and inter-channel interference thresholds according to specifications of given SAW filters 115 and/or derive an optimization of SAW filters frequency bands 116A, B and channel bandwidths 121A-F under given scenarios and requirements. The example in each of FIGS. 4A and 4B illustrates schematically one SAW filters frequency bands 116A and 116B respectively, a central channel 121A to be filtered by the respective SAW filter, and adjacent channels 121B-F with their respective attenuation with respect to central channel 121A, overlapped on the SAW filter transfer function. It is noted that SAW filters 115 provide a narrow channel width of a few MHz and steep channel edges which allow good separation between a large number of channels, e.g., in the UHF region of several hundred MHz.

For example, SAW filters 115 were designed to provide an attenuation of ca. 50 dB between adjacent channels (e.g., 121A, 121B), ca. 60 dB between singly separated channels (e.g., 121A, 121C) and ca. 100 dB between doubly separated channels (e.g., 121A, 121D). Thee analog attenuations may be combined with digital attenuations provided by converter 111 (ADC and/or DAC, e.g., 50 dB) and other components to provide high level immunity of one channel to adjacent channels, even at large differences of intensity (e.g., up to 100 dB, 120 dB etc.). Specific required attenuations may be incorporated into the exact design details of device according to the illustrated principles.

Specific SAW filter technologies, e.g., ladder, double mode (DMS) or hybrid SAW filter structures may be selected to provide the best fitting filters. In certain embodiments, ladder structured SAW filters were configured to operate in device 100.

The shape factor (SF) of the SAW filters provides better selectivity in the receiver, better spectral purity in the transmitter and generally less noise; and also allows using closer antennas in adjacent devices with less mutual interference due to lower lateral disturbances between channels.

Figure 5:
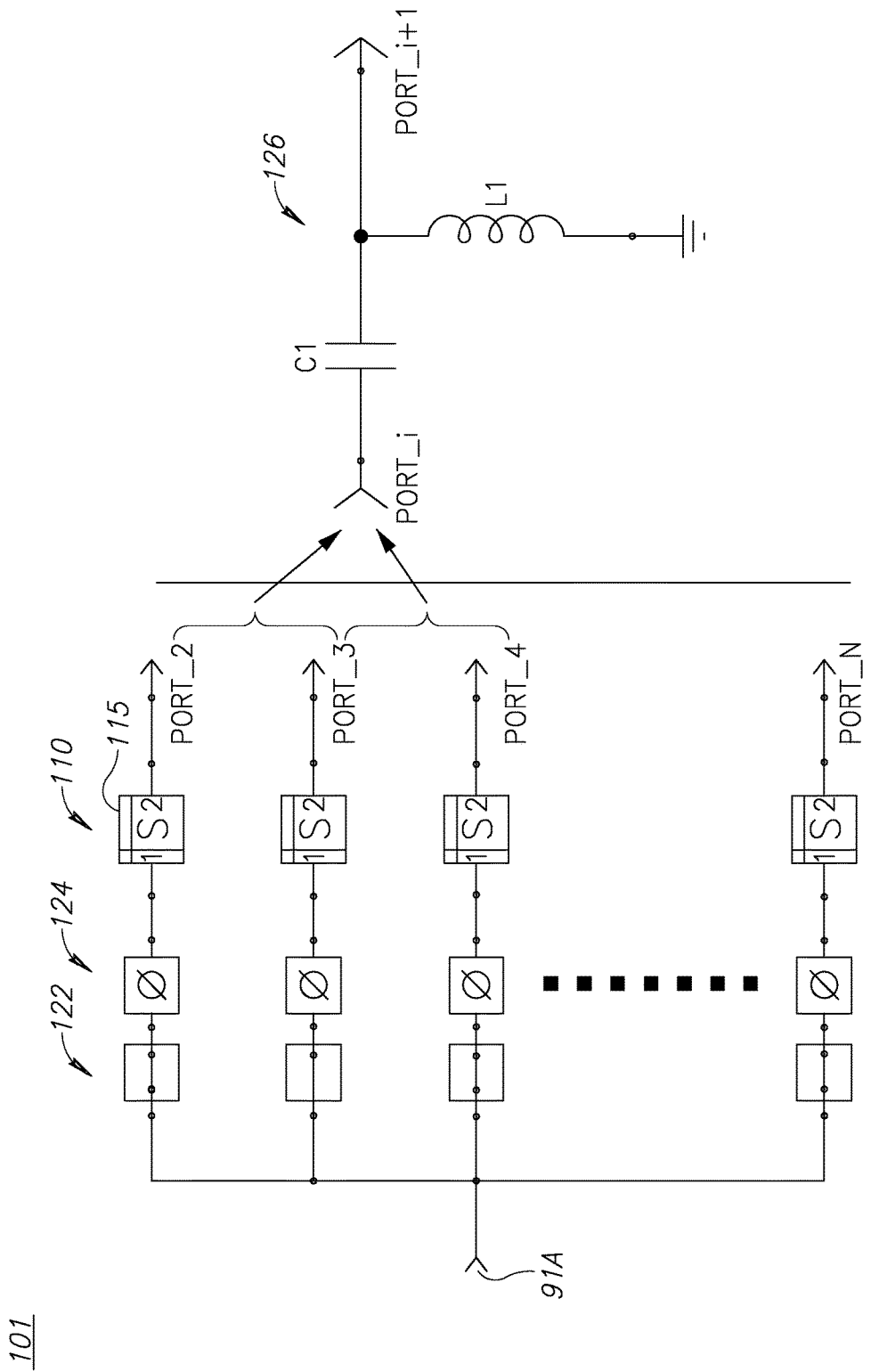
FIG. 5 is a high level schematic illustration of phase adaptations that may be carried out between SAW filters in the filter bank, according to some embodiments of the invention.

FIG. 5 is a high level schematic illustration of phase adaptations that may be carried out between SAW filters 115 in filter bank 110, according to some embodiments of the invention. In certain embodiments, interferences between signals in different channels may be reduced by configuring the relative phases between the channels, using phase shifting circuitry comprising switches 122, phase shifters 124 and inductive and capacitive components 126 in association with SAW filters 115, e.g., in receiver 101.

Figure 1B:
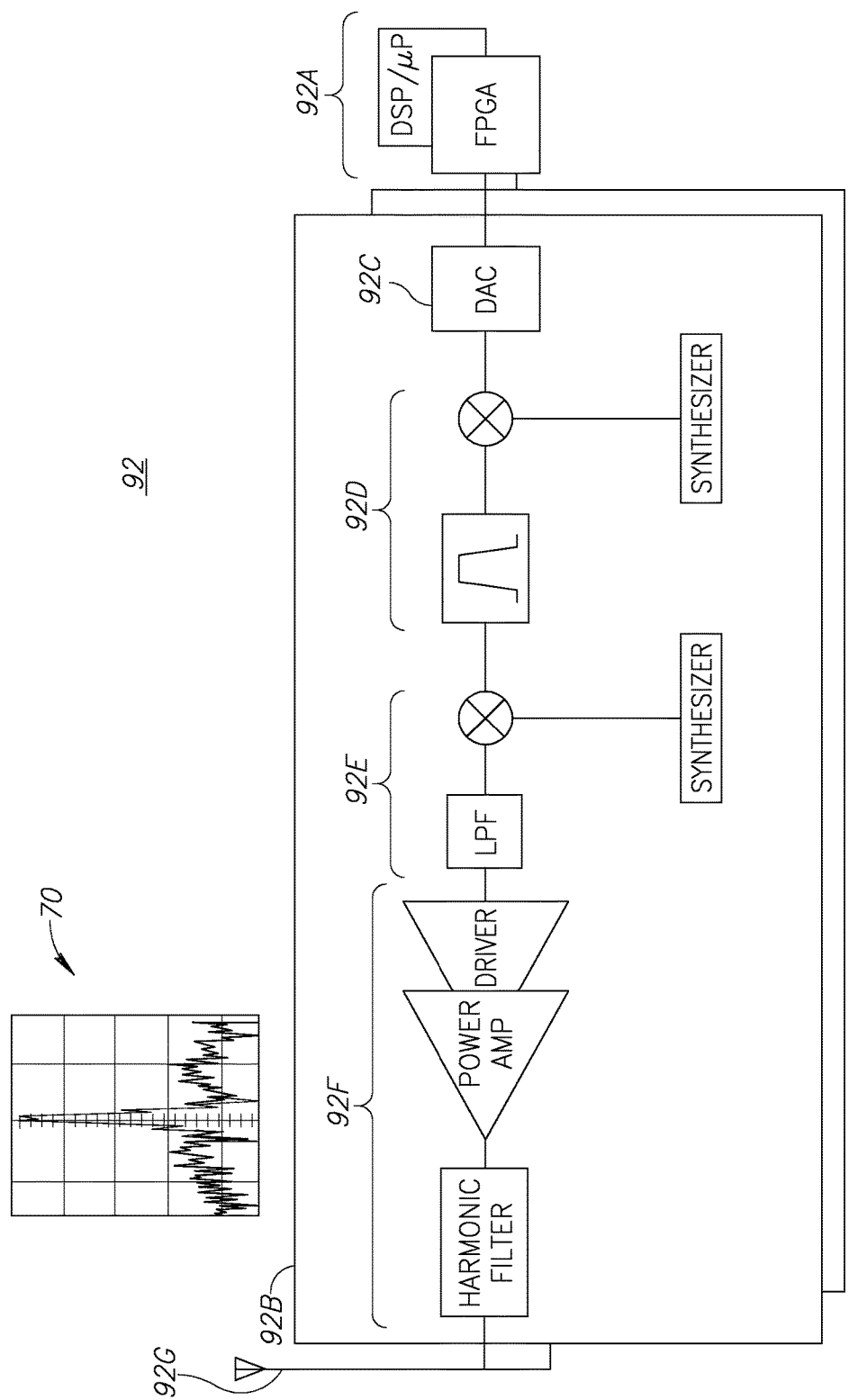
Figure 6:
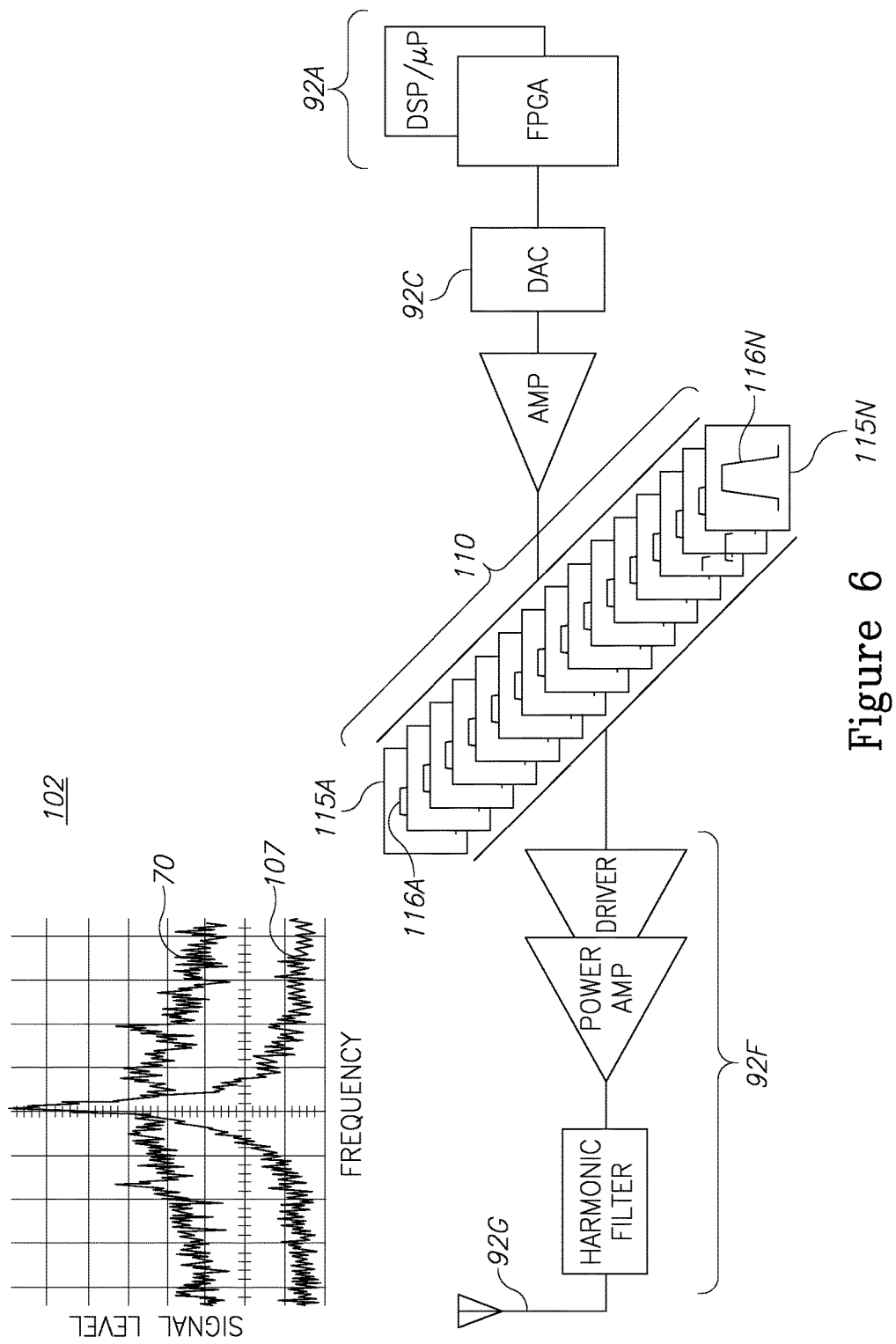
FIG. 6 is a high level schematic block diagram of a multi-channel UHF transmitter, according to some embodiments of the invention.

FIG. 6 is a high level schematic block diagram of multi-channel UHF transmitter 102, according to some embodiments of the invention. FIG. 6 exemplifies device 100 configured as transmitter 102 in UHF, as a comparison to prior art transmitter 92 depicted in FIG. 1B. In place of the cumbersome set of modulation stages 92B, transmitter 102 essentially comprises broadband DAC 92C connected to filter bank 110 of SAW filters 115, broadband DAC 92C spanning the combined frequency band range of SAW filters 115 in filter bank 110 and SAW filters 115 possibly fitted on a small printed board. SAW filters 115 may be configured to provide N transmission channels, each of filters 115A-115N having distinct frequency band 116A-116N. Signals from processing unit(s) 92A may be passed through broadband DAC 92C, amplified and separated to multiple channels in filter bank 110. The resulting channels may then be amplified and filtered in stage 92F before being broadcast through antenna 92G, to yield a much cleaner 107 than prior art signal 70.

Figure 7:
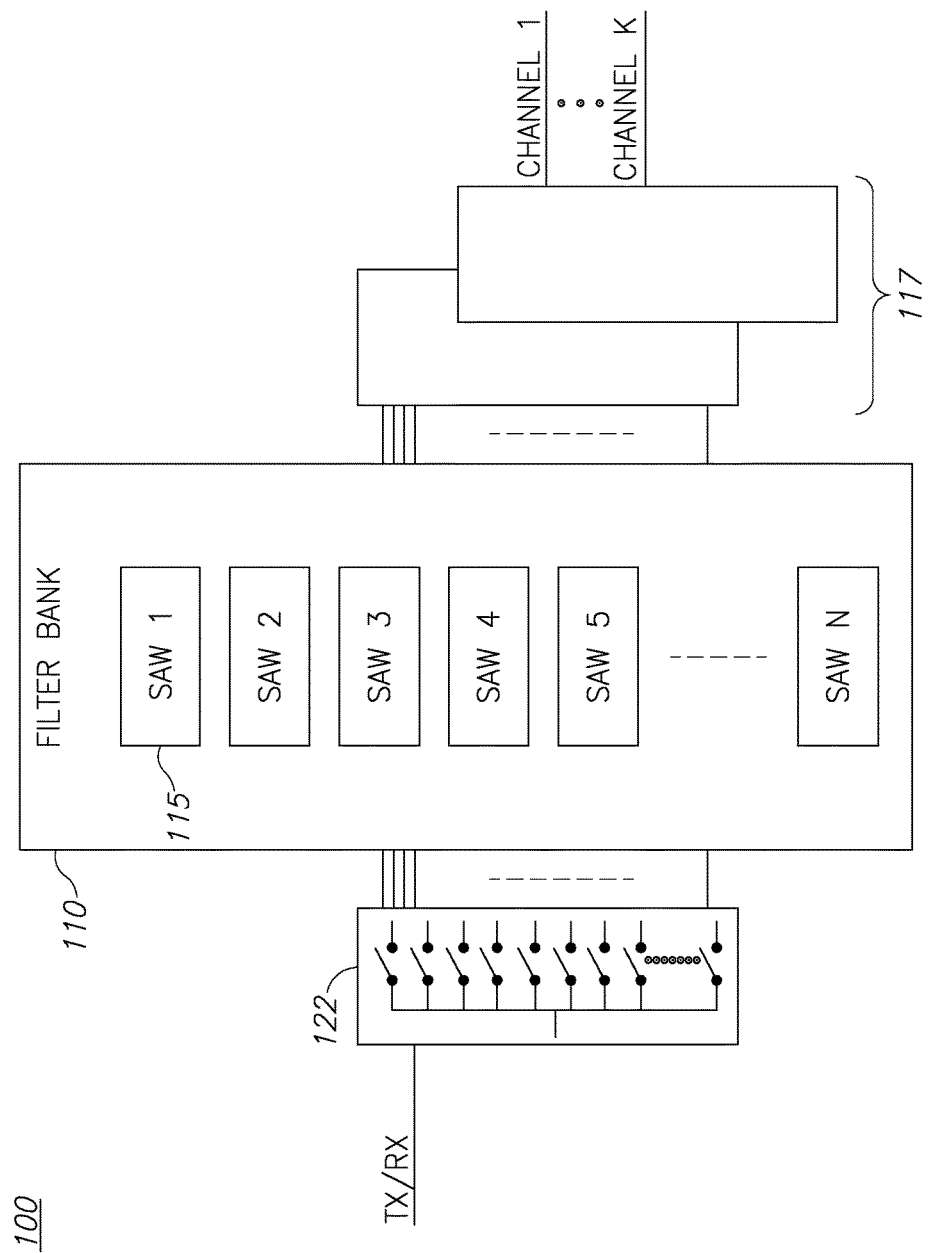
FIG. 7 is a high level schematic block diagram of switching in the device, according to some embodiments of the invention.

FIG. 7 is a high level schematic block diagram of switching in device 100, according to some embodiments of the invention. Filter bank 110 with SAW filters 1 . . . N 115 may be used to provide any number of channels 1 . . . K with associated components 117, e.g., by applying multiple switches 122 to regulate signal flow through SAW filters 115 in filter bank 110. The number of channels may be modified during operation of device 100.

Figure 8A:
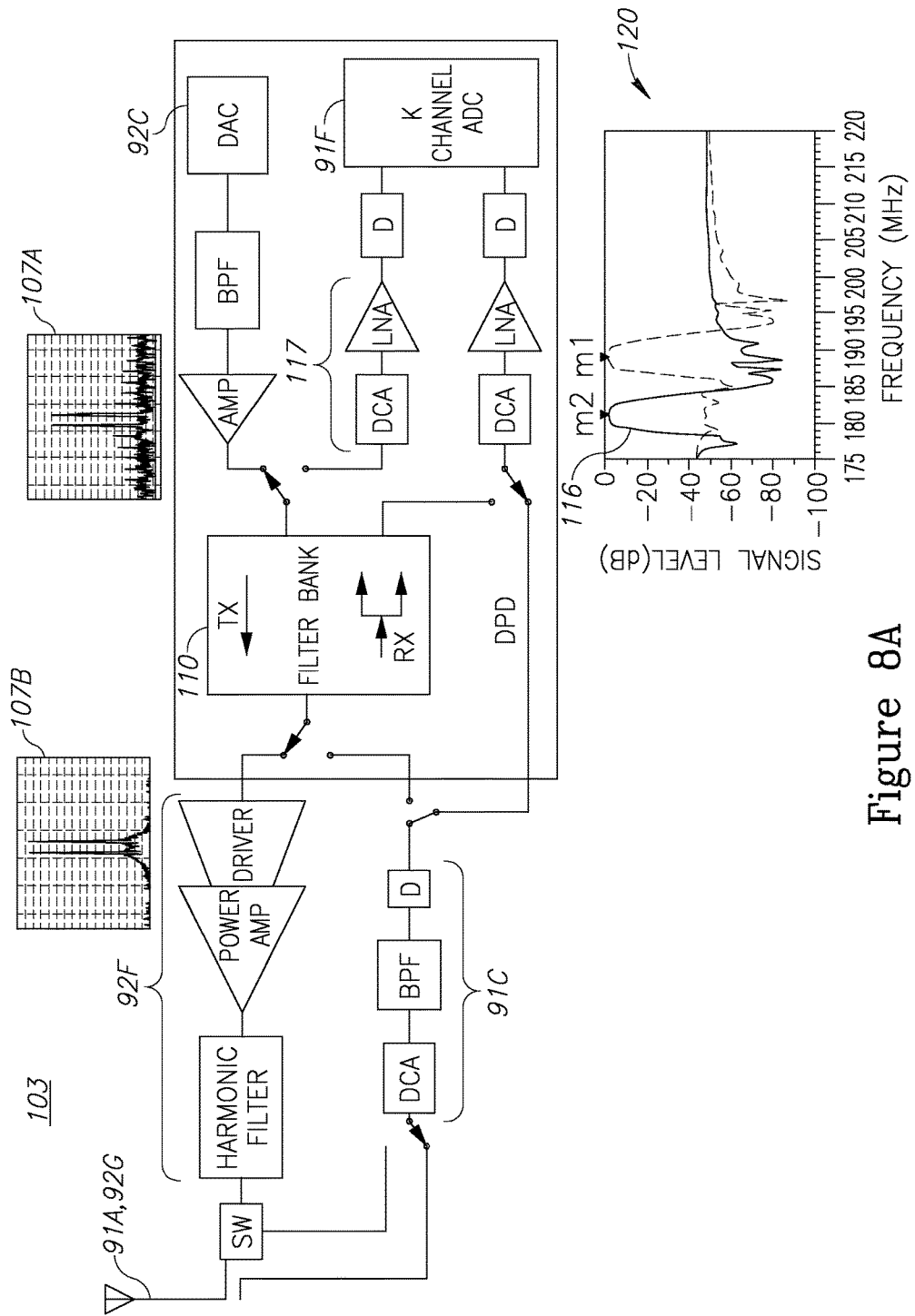
FIGS. 8A and 8B are high level schematic block diagrams of transceivers, according to some embodiments of the invention.
Figure 8B:
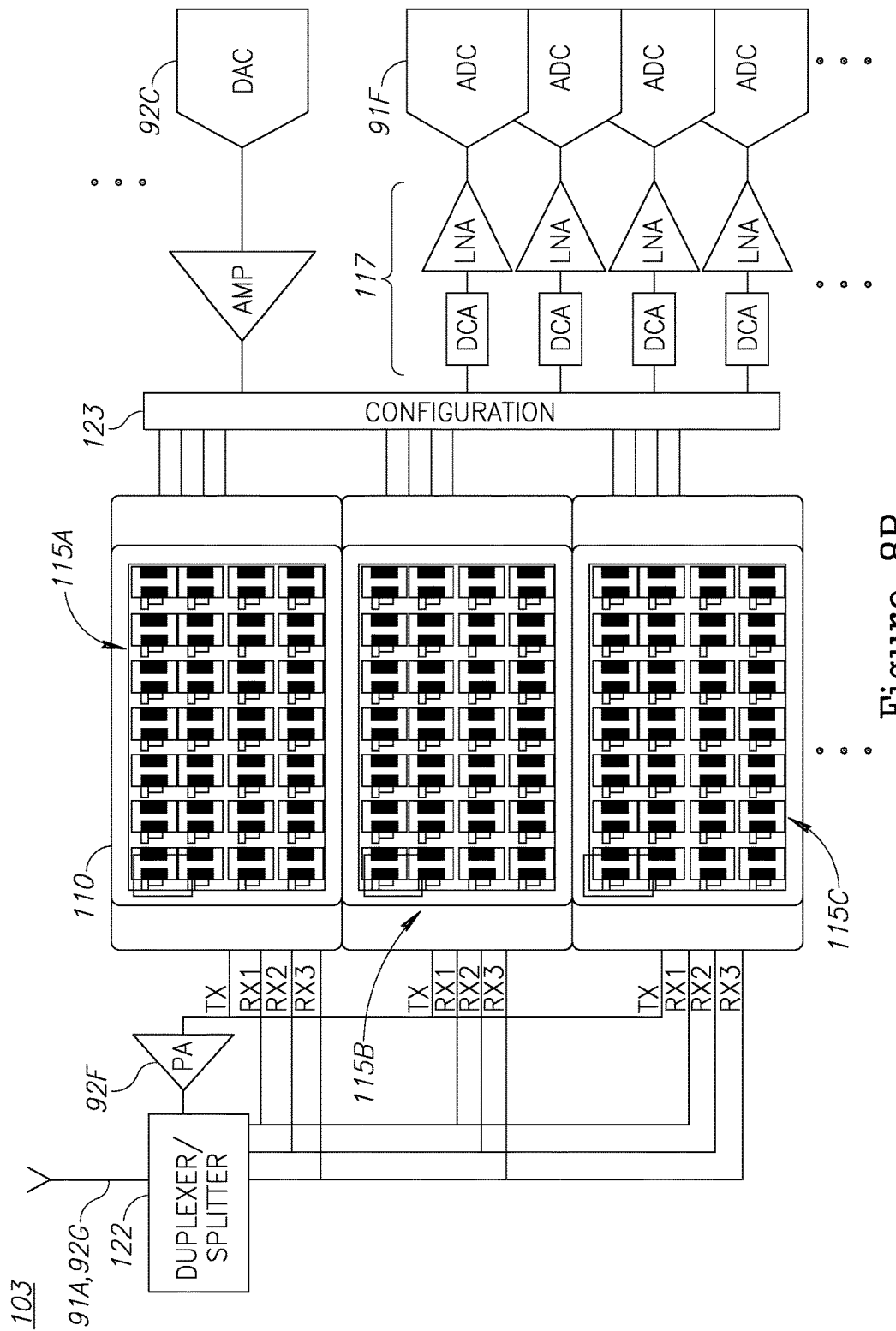

FIGS. 8A and 8B are high level schematic block diagrams of transceivers 103, according to some embodiments of the invention. FIG. 8A illustrates a non-limiting example, with a configuration having a single transmission channel and two reception channels (K=2), with corresponding components DAC 92C, stage 92F and signal illustrations 107A, 107B; and stages 91C, 117, ADC 91F and illustration of two frequency bands 120, respectively, integrated with a corresponding switching circuitry scheme. It is emphasized that the illustrated example of one transmission channel and two reception channels is non-limiting, and that the present disclosure includes transceivers with any number of transmission channels and any number of reception channels.

FIG. 8B illustrates another non-limiting example, in which filters 115 belonging to different channels are separated from each other (spatially in filter bank 110), to avoid interruptions and cross talk. For example, filters 115A belonging to a certain set of consecutive channels may be positioned at positions 1, 4, 7 etc. in filter bank 110, filters 115B belonging to another set of consecutive channels may be positioned at positions 2, 5, 8 etc. in filter bank 110, and filters 115C belonging to yet another set of consecutive channels may be positioned at positions 3, 6, 9 etc. in filter bank 110, so that adjacent filters 115 in filter bank are well separated with respect to their frequency bands 116. Separating spectrally-adjacent filters spatially (e.g., into groups 115A, 115B, 115C) enable simultaneous transmission and/or reception at spectrally-adjacent channels without reciprocal interference. A configuration circuitry 123 and duplexer/splitter 122 are used to direct the communication signals to and from respective filters 115. Any number of transmission sections, reception sections and filter groups may be realized, according to given specifications.

In certain embodiments, the frequency bands of SAW filters 115 may be about 10 MHz wide. In certain embodiments, the frequency bands of SAW filters 115 may be about 20 MHz wide. In certain embodiments, the bandwidth of converter 111 may comprise several hundred MHz, particularly when device 100 operates in UHF. ADC 91F and/or DAC 92F may have bandwidths of several hundred MHz, e.g., 300 Mhz, 500 MHz, 800 Mhz, etc. Such converters are available as ADCs and DACs with wide dynamic ranges. In certain embodiments, combinations of 10 MHz wide SAW filters frequency bands and 500 MHz wide converters (ADC and/or DAC) provide tens of channels. It is noted that a large number of channels is particularly useful in the UHF and the VHF, in which available spectrum is segmented into disparate section. It is further noted that each channel may be managed by applying customary methods such as different modulations, encryption, time sharing, frequency hopping, etc.

Figure 9:
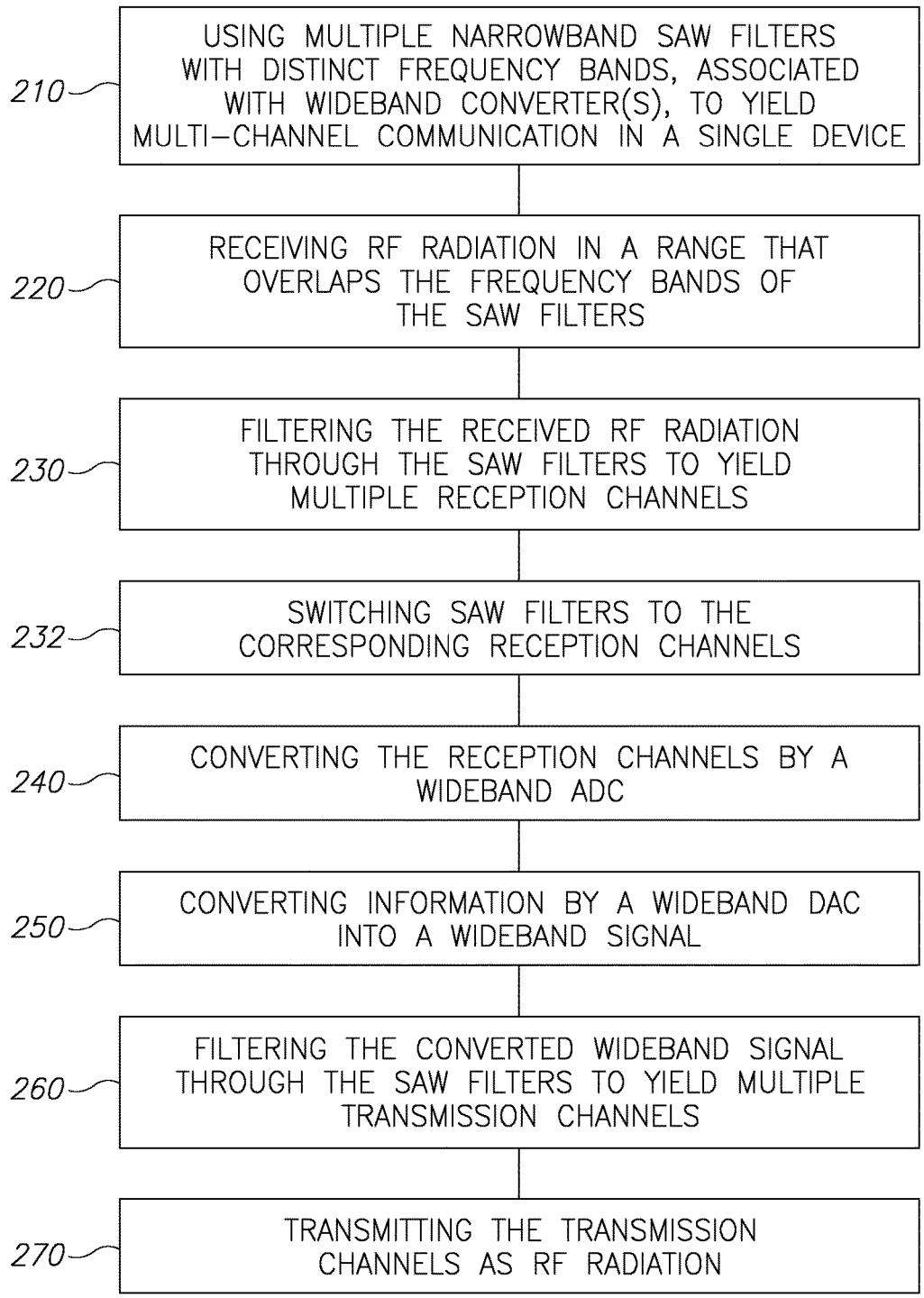
FIG. 9 is a high level schematic flowchart of a multi-channel communication method, according to some embodiments of the invention.

FIG. 9 is a high level schematic flowchart of a multi-channel communication method 200, according to some embodiments of the invention. Method 200 may comprise using a plurality of narrowband SAW filters having respective distinct frequency bands associated with at least one wideband converter having a bandwidth that comprises the filters' frequency bands, to yield multi-channel communication (stage 210).

In certain embodiments, method 200 may comprise receiving RF radiation within a specified frequency band that at least partly overlaps the frequency bands of the SAW filters (stage 220), filtering the received RF radiation through the SAW filters to yield a plurality of reception channels (stage 230), and converting the reception channels by the at least one wideband converter, configured as a wideband ADC (stage 240).

In certain embodiments, method 200 may comprise converting information by the at least one wideband converter, configured as a wideband DAC, into a wideband signal (stage 250), filtering the converted wideband signal through the SAW filters to yield a plurality of transmission channels (stage 260), and transmitting the transmission channels as RF radiation (stage 270).

In certain embodiments, method 200 may comprise, using ADC and DAC as wideband converters, receiving RF radiation within a specified frequency band that at least partly overlaps the frequency bands of the SAW filters (stage 220), filtering the received RF radiation through the SAW filters to yield a plurality of reception channels (stage 230), converting the reception channels by the wideband ADC (stage 240), converting information by the wideband DAC into a wideband signal (stage 250), filtering the converted wideband signal through the SAW filters to yield a plurality of transmission channels (stage 260), and transmitting the transmission channels as RF radiation (stage 270), possibly separating, spatially in the filter bank, the SAW filters belonging to different channels.

Method 200 may be carried out in UHF, with the frequency bands of the SAW filters being within the specified frequency band of the antenna, and may further comprise switching the SAW filters to the corresponding reception channels (stage 232).

Advantageously, with respect to prior art such as U.S. Patent Publication No. 20130178179, U.S. Patent Publication No. 2014062614, Chinese Patent Document No. 101452013 and U.S. Pat. No. 3,855,556, the current invention provides multichannel transceivers (and/or receivers and/or transmitter) which use the filter bank in association with corresponding wideband converters to implement simultaneous multi-channel digital radio communications at UHF frequencies.

Advantageously, such systems reduce significantly the number of required components with respect to heterodyne-based devices, reduce the power consumption and consequentially increase the battery life for portable devices (e.g., handheld device, backpack devices).

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A compact multi-channel digital radio device, comprising:
   at least one antenna;
   at least one wideband converter; and,
   a filter bank connected between said at least one antenna and said at least one wideband converter, said filter bank comprising a plurality of narrowband surface acoustic wave (SAW) filters having respective distinct frequency bands within a bandwidth of the at least one wideband converter;
   wherein each of said distinct frequency bands comprises a plurality of distinct channels, each having a respective narrow channel width and steep channel edges for channel separation; and,
   wherein said filter bank and said at least one wideband converter are associated to implement simultaneous multi-channel digital radio communications at ultra-high frequencies (UHF).

2. The multi-channel digital radio device of claim 1, configured as a receiver, wherein the at least one wideband converter is an analog to digital converter (ADC), the at least one antenna is configured to receive radiofrequency (RF) radiation within a specified frequency band that at least partly overlaps the frequency bands of the SAW filters and the bandwidth of the ADC, and wherein the receiver is configured to deliver a plurality of reception channels to a processing unit, the reception channels corresponding to at least some of the plurality of channels and being converted by the ADC.

3. The multi-channel digital radio device of claim 1, configured as a transmitter, wherein the at least one wideband converter is a digital to analog converter (DAC), the at least one antenna is configured to transmit radiofrequency (RF) radiation within a specified frequency band that at least partly overlaps the frequency bands of the SAW filters and the bandwidth of the DAC, and wherein the transmitter is configured to deliver a plurality of transmission channels from a processing unit, the transmission channels corresponding to at least some of the plurality of channels and being converted by the DAC.

4. The multi-channel digital radio device of claim 1, configured as a transceiver, wherein the at least one wideband converter comprises an analog to digital converter (ADC) and a digital to analog converter (DAC), the at least one antenna is configured to receive and transmit radiofrequency (RF) radiation within a specified frequency band that at least partly overlaps the frequency bands of the SAW filters and the bandwidths of ADC and the DAC, and wherein the transceiver is configured to deliver a plurality of reception channels to a processing unit, the reception channels corresponding to at least some of the plurality of channels and being converted by the ADC, and to deliver a plurality of transmission channels from the processing unit, the transmission channels corresponding to at least some of the plurality of channels and being converted by the DAC.

5. The multi-channel digital radio device of claim 4, wherein the SAW filters associated with different channels are spatially separated in the filter bank.

6. The multi-channel digital radio device of claim 1, wherein the frequency bands of the SAW filters are 10 MHz wide.

7. The multi-channel digital radio device of claim 1, wherein the bandwidth of the at least one converter is several hundred MHz.

8. The multi-channel digital radio device of claims 4, further comprising a bandpass filter (BPF) between the at least one antenna and the filter bank and a plurality of low-noise amplifiers (LNAs) connected at respective reception channels before the ADC.

9. The multi-channel digital radio device of claim 8, further comprising switching circuitry configured to connect SAW filters to the corresponding reception channels.

10. The multi-channel digital radio device of claim 4, further comprising amplifiers before and after the filter bank and a harmonic filter between the amplifier that follows the filter bank and the at least one antenna.

11. A compact multi-channel digital radio method, comprising:
using a plurality of narrowband SAW filters having respective distinct frequency bands in association with at least one wideband converter having a bandwidth that comprises the filters' frequency bands, to implement simultaneous multi-channel communications at ultra-high frequencies (UHF),
wherein each of said distinct frequency bands comprises a plurality of channels, each having respective narrow channel width and steep channel edges for channel separation.

12. The multi-channel digital radio method of claim 11, further comprising: receiving RF radiation within a specified frequency band that at least partly overlaps the frequency bands of the SAW filters, filtering the received RF radiation through the SAW filters to yield a plurality of reception channels, and converting the reception channels by the at least one wideband converter, configured as a wideband ADC.

13. The multi-channel digital radio method of claim 11, further comprising: converting information by the at least one wideband converter, configured as a wideband DAC, into a wideband signal, filtering the converted wideband signal through the SAW filters to yield a plurality of transmission channels, and transmitting the transmission channels as RF radiation.

14. The multi-channel digital radio method of claim 11, wherein the at least one wideband converter comprises an ADC and a DAC, the method further comprising: receiving RF radiation within a specified frequency band that at least partly overlaps the frequency bands of the SAW filters, filtering the received RF radiation through the SAW filters to yield a plurality of reception channels, converting the reception channels by the ADC, converting information by the DAC into a wideband signal, filtering the converted wideband signal through the SAW filters to yield a plurality of transmission channels, and transmitting the transmission channels as RF radiation.

15. The multi-channel digital radio method of claim 14, further comprising spatially separating the SAW filters associated with different channels.

16. The multi-channel digital radio method of claim 14, further comprising switching the SAW filters to the corresponding reception channels.

* * * * *